(12) United States Patent
Clark et al.

(10) Patent No.: US 8,901,432 B2
(45) Date of Patent: Dec. 2, 2014

(54) MITIGATION OF BLOCK BENDING IN A RING LASER GYROSCOPE CAUSED BY THERMAL EXPANSION OR COMPRESSION OF A CIRCUIT BOARD

(75) Inventors: Matthew Clark, Morristown, NJ (US); Craig A. Galbrecht, Morristown, NJ (US); George Goblish, Morristown, NJ (US); Myles Koshiol, Morristown, NJ (US)

(73) Assignee: Honeywell International Inc., Morristown, NJ (US)

( * ) Notice: Subject to any disclaimer, the term of this patent is extended or adjusted under 35 U.S.C. 154(b) by 330 days.

(21) Appl. No.: 13/250,503

(22) Filed: Sep. 30, 2011

(65) Prior Publication Data

US 2013/0081860 A1    Apr. 4, 2013

(51) Int. Cl.
*H05K 1/11*  (2006.01)
*H05K 1/02*  (2006.01)

(52) U.S. Cl.
CPC .... *H05K 1/0271* (2013.01); *H05K 2201/09063* (2013.01); *H05K 2201/09027* (2013.01); *H05K 2201/09854* (2013.01); *H05K 2201/068* (2013.01)
USPC ............ 174/260; 174/250; 361/748; 361/767

(58) Field of Classification Search
USPC .......... 174/250, 254, 261, 260; 361/748, 749, 361/760, 767, 768
See application file for complete search history.

(56) References Cited

U.S. PATENT DOCUMENTS

| | | |
|---|---|---|
| 4,565,941 A | 1/1986 | Ridgway et al. |
| 4,651,116 A | 3/1987 | Schloemann |
| 4,951,521 A | 8/1990 | Jacobson |
| 5,004,639 A | 4/1991 | Desai |
| 5,088,825 A | 2/1992 | Derry et al. |
| 5,127,016 A | 6/1992 | Podgorski |
| 5,148,076 A | 9/1992 | Albers et al. |
| 5,162,870 A | 11/1992 | Toth |
| 5,193,391 A | 3/1993 | Cage |
| 5,309,459 A | 5/1994 | Hrovat |

(Continued)

FOREIGN PATENT DOCUMENTS

| | | |
|---|---|---|
| EP | 2490251 | 8/2012 |
| JP | 2004292821 | 10/2004 |
| WO | 2007008310 | 1/2007 |
| WO | 2011046238 | 4/2011 |

OTHER PUBLICATIONS

"Thermal Management Solutions for Electronics", "downloaded from http://www.arlon-med.com/ArlonThermalMgmtGuide.pdf on Sep. 26, 2011", 2008, pp. 1-20.

(Continued)

*Primary Examiner* — Hoa C Nguyen
*Assistant Examiner* — Amol Patel
(74) *Attorney, Agent, or Firm* — Fogg & Powers LLC

(57) ABSTRACT

An apparatus includes a sheet of circuit board material, at least one electrically conductive trace positioned on the sheet of circuit board material, and at least one electrically conductive contact pad positioned on the sheet of circuit board material and coupled to the at least one electrically conductive trace. The apparatus further includes at least one deformation point configured to absorb stresses developed in the sheet of circuit board material when the sheet of circuit board material experiences resistance to expansion or compression caused by connection to an object resisting expansion or compression.

20 Claims, 9 Drawing Sheets

(56) References Cited

U.S. PATENT DOCUMENTS

| | | | |
|---|---|---|---|
| 5,363,194 | A | 11/1994 | Killpatrick et al. |
| 5,372,427 | A | 12/1994 | Padovani et al. |
| 5,390,019 | A | 2/1995 | Fritze et al. |
| 5,400,141 | A | 3/1995 | Albers et al. |
| 5,428,190 | A | 6/1995 | Stopperan |
| 5,438,410 | A | 8/1995 | Killpatrick et al. |
| 5,450,198 | A | 9/1995 | Killpatrick et al. |
| 5,486,920 | A | 1/1996 | Killpatrick et al. |
| 5,780,771 | A | 7/1998 | Beckwith et al. |
| 5,831,333 | A | 11/1998 | Malladi et al. |
| 6,011,693 | A * | 1/2000 | Gore .................... 361/760 |
| 6,108,358 | A | 8/2000 | Albers |
| 6,208,414 | B1 | 3/2001 | Killpatrick et al. |
| 6,625,854 | B1 | 9/2003 | Sudol et al. |
| 6,870,867 | B2 | 3/2005 | Pontis et al. |
| 6,918,297 | B2 | 7/2005 | MacGugan |
| 6,934,448 | B2 | 8/2005 | Akashi et al. |
| 6,953,985 | B2 | 10/2005 | Lin et al. |
| 7,117,934 | B2 | 10/2006 | Lomax, Jr. et al. |
| 7,308,827 | B2 | 12/2007 | Holt et al. |
| 7,526,402 | B2 | 4/2009 | Tanenhaus et al. |
| 7,535,574 | B2 | 5/2009 | Beckwith et al. |
| 8,018,229 | B1 | 9/2011 | Horning et al. |
| 8,480,826 | B2 * | 7/2013 | Segal et al. .................... 156/64 |
| 2002/0166379 | A1 | 11/2002 | Paros et al. |
| 2004/0169244 | A1 | 9/2004 | MacGugan |
| 2006/0196266 | A1 | 9/2006 | Holt et al. |
| 2006/0271246 | A1 | 11/2006 | Bell et al. |
| 2007/0032951 | A1 | 2/2007 | Tanenhaus et al. |
| 2007/0170438 | A1 | 7/2007 | Partridge et al. |
| 2007/0170439 | A1 | 7/2007 | Partridge et al. |
| 2007/0170440 | A1 | 7/2007 | Partridge et al. |
| 2007/0170528 | A1 | 7/2007 | Partridge et al. |
| 2007/0170529 | A1 | 7/2007 | Partridge et al. |
| 2007/0170530 | A1 | 7/2007 | Partridge et al. |
| 2007/0170531 | A1 | 7/2007 | Partridge et al. |
| 2007/0170532 | A1 | 7/2007 | Partridge et al. |
| 2007/0172976 | A1 | 7/2007 | Partridge et al. |
| 2007/0181962 | A1 | 8/2007 | Partridge et al. |
| 2007/0266784 | A1 | 11/2007 | Lust et al. |
| 2008/0290494 | A1 | 11/2008 | Lutz |
| 2009/0212386 | A1 | 8/2009 | Ridley et al. |
| 2009/0260435 | A1 | 10/2009 | Mayer-Wegelin et al. |
| 2011/0024860 | A1 | 2/2011 | Herrnsdorf et al. |
| 2011/0037180 | A1 | 2/2011 | Yoo et al. |

OTHER PUBLICATIONS

Dorobantu et al., "Investigation of Navigation-Grade RLG SIMU type iNAV-RQH", 2004, pp. 1-44, No. 16, Publisher: Technische Universitat Munchen.

"Platinum Chip SMD Temperature Sensor", "Downloaded from http://www.enercorp.com/temp/products/pdf/pcs11503.pdf on Sep. 11, 2011 (http://www.enercorp.com/New_Products/RTD_Temperature_Sensor.htm)", Apr. 2001, p. 1 Publisher: Enercorp instruments ltd.

Finstad, "Basics of Flex Circuit Design", "downloaded from http://www.minco.com/download-media.aspx?id=2304&wp=Download on Sep. 22, 2011", 2008, pp. 1-12, Publisher: Minco.

Finstad, "Balancing the Electrical and Mechanical Requirements of Flexible Circuits", "downloaded from http://www.minco.com/download-media.aspx?id=2302&wp=Download on Sep. 22, 2011", 2008, pp. 1-10, Publisher: Minco.

King et al, "Inertial Navigation—Forty Years of Evolution", "GEC Review", 1998, pp. 140-149, vol. 13, No. 3, Publisher: Marconi Electronic Systems Ltd.

Mark et al, "A Resolution Enhancement Technique for Laser Gyros", "downloaded from http://www.es.northropgrumman.com/media/whitepapers/assets/Resolution_Enhancement_Techniq.pdf on Sep. 22, 2011", May 26, 1997, pp. 1-14.

"Designing for Flexibility and Reliability", "downloaded from http://www.minco.com/WorkArea/linkit.aspx?LinkIdentifier=id&ItemID=1132 on Sep. 22, 2011", 2006, pp. 1-5, Publisher: Minco.

"Flex Circuits Design Guide", "downloaded from http://www.minco.com/uploadedFiles/Products/Flex_Circuits/Technical_Specifications/FC302.pdf on Sep. 22, 2011", 2007, pp. 1-32, Publisher: Minco.

"Potting Solutions", "downloaded from http://www.pottingsolutions.com/my%20site/Technology/potting_hints.htm on Sep. 26, 2011", Jul. 24, 2011, pp. 1-4.

Sharma, "A Reliable Wafer-Level Chip Scale Package (WLCSP) Technology", "downloaded from http://akromuhendislik.com/files/TechnicalPapers/wlcsp_cmd_ozen.pdf on Sep. 26, 2011", May 2000, pp. 1-6.

Volk et al, "Multioscillator Ring Laser Gyroscopes and Their Applications", "downloaded from http://www.es.northropgrumman.com/media/whitepapers/assets/Multioscillator_Ring_Laser_Gyr.pdf on Sep. 22, 2011", 1999, pp. 1-20.

European Patent Office, "Office Action", "from Foreign Counterpart of U.S. Appl. No. 13/250,503", Nov. 12, 2013, pp. 1-6, Published in: EP.

European Patent Office, "European Search Report", "from Foreign Counterpart of U.S. Appl. No. 13/250,503", Oct. 24, 2013, pp. 1-3, Published in: EP.

* cited by examiner

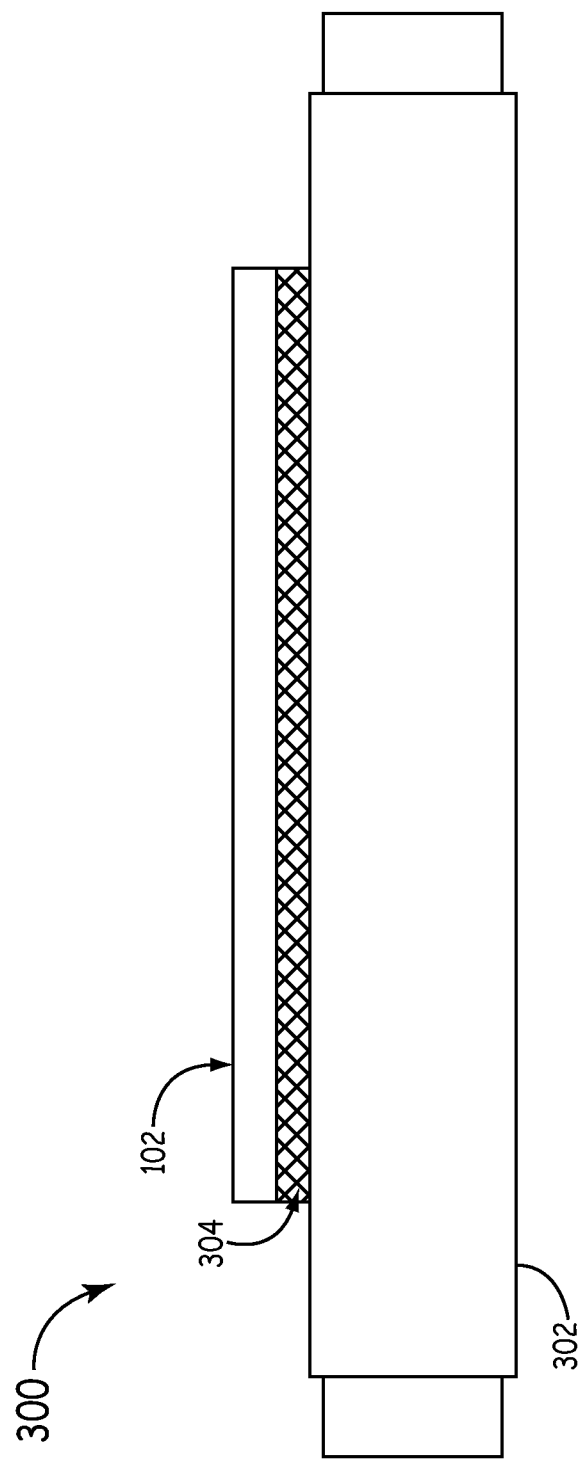

500

MOUNTING BOTTOM SURFACE OF SHEET OF CIRCUIT BOARD MATERIAL TO TOP SURFACE OF SUBSTRATE USING ADHESIVE CONFIGURED TO INHIBIT TRANSFER OF STRESSES GENERATED IN CIRCUIT BOARD MATERIAL WHEN SHEET OF CIRCUIT BOARD MATERIAL EXPANDS OR CONTRACTS AT DIFFERENT RATE THAN OBJECT
502

MITIGATION OF BLOCK BENDING IN A RING LASER GYROSCOPE CAUSED BY THERMAL EXPANSION OR COMPRESSION OF A CIRCUIT BOARD

BACKGROUND

Ring Laser Gyroscopes (RLGs) can experience performance errors and power loss due to mechanical bending of the laser block. Mechanical bending of the block can occur during exposures to temperature extremes if components are rigidly mounted to the laser block and possess different coefficients of thermal expansion from the laser block material. Laser block bending changes the internal alignment of the mirrors and causes changes in gyro power and performance.

SUMMARY

An apparatus includes a sheet of circuit board material, at least one electrically conductive trace positioned on the sheet of circuit board material, and at least one electrically conductive contact pad positioned on the sheet of circuit board material and coupled to the at least one electrically conductive trace. The apparatus further includes at least one deformation point configured to absorb stresses developed in the sheet of circuit board material when the sheet of circuit board material experiences resistance to expansion or compression caused by connection to an object resisting expansion or compression.

DRAWINGS

Understanding that the drawings depict only exemplary embodiments and are not therefore to be considered limiting in scope, the exemplary embodiments will be described with additional specificity and detail through the use of the accompanying drawings, in which:

FIG. 3 is a side view diagram depicting an exemplary embodiment of a circuit board attached to a RLG with a particular adhesive to mitigate block bending in the laser block of the RLG.

Figure 1A:
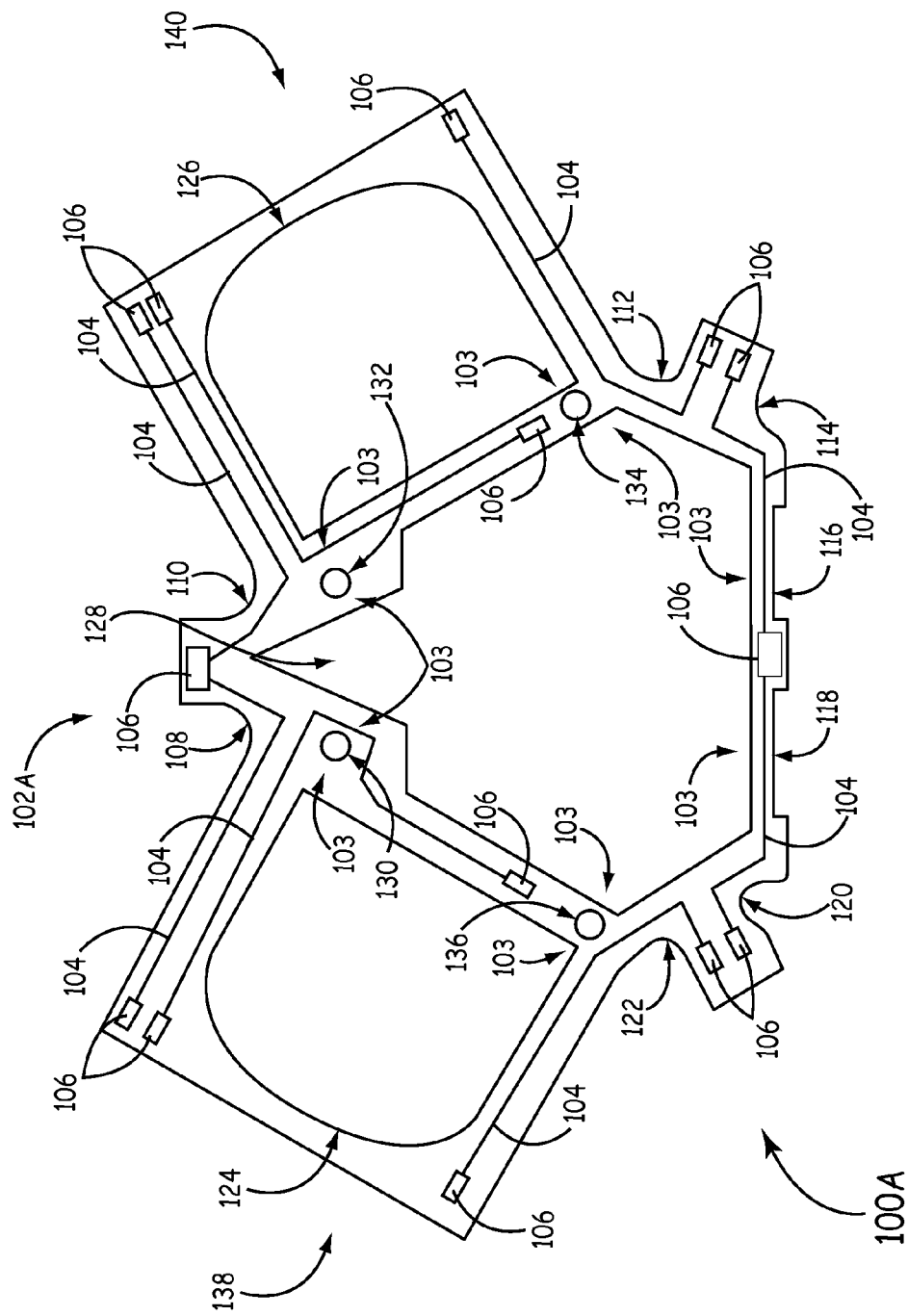
FIGS. 1A-1C are top view diagrams depicting exemplary embodiments of a circuit board having deformation points to mitigate block bending in a laser block.

In accordance with common practice, the various described features are not drawn to scale but are drawn to emphasize specific features relevant to the exemplary embodiments.

DETAILED DESCRIPTION

In the following detailed description, reference is made to the accompanying drawings that form a part hereof, and in which is shown by way of illustration specific illustrative embodiments. However, it is to be understood that other embodiments may be utilized and that logical, mechanical, and electrical changes may be made. Furthermore, the method presented in the drawing figures and the specification is not to be construed as limiting the order in which the individual steps may be performed. The following detailed description is, therefore, not to be taken in a limiting sense.

The embodiments described below provide systems and methods for mitigating block bending in laser blocks (and other objects) caused by attachment of circuit board assemblies. More specifically, a circuit board assembly can be created with deformation points to absorb stresses developed in the circuit board assembly when the circuit board assembly experiences resistance to expansion or compression caused by connection to a laser block (or other object) resisting expansion or compression. In exemplary embodiments, these deformation points are created by removing portions of the circuit board assembly using cutouts. In other exemplary embodiments, these deformation points are created in other ways, such as by forming the circuit board material into specific geometries including forming folds, zig-zag shapes, accordion configurations, or other shapes to absorb the stresses by deforming. In other exemplary embodiments, a complete disconnect between two portions of the circuit board becomes a deformation point 103 (such as the disconnects formed by cutouts 146 and 148 shown in FIGS. 1B and 2B). In addition, a circuit board assembly can be attached to a laser block using a particular adhesive that allows for a larger change in the size of the circuit board without transferring thermal stresses to the laser block and causing block bending in the laser block.

Figure 1B:
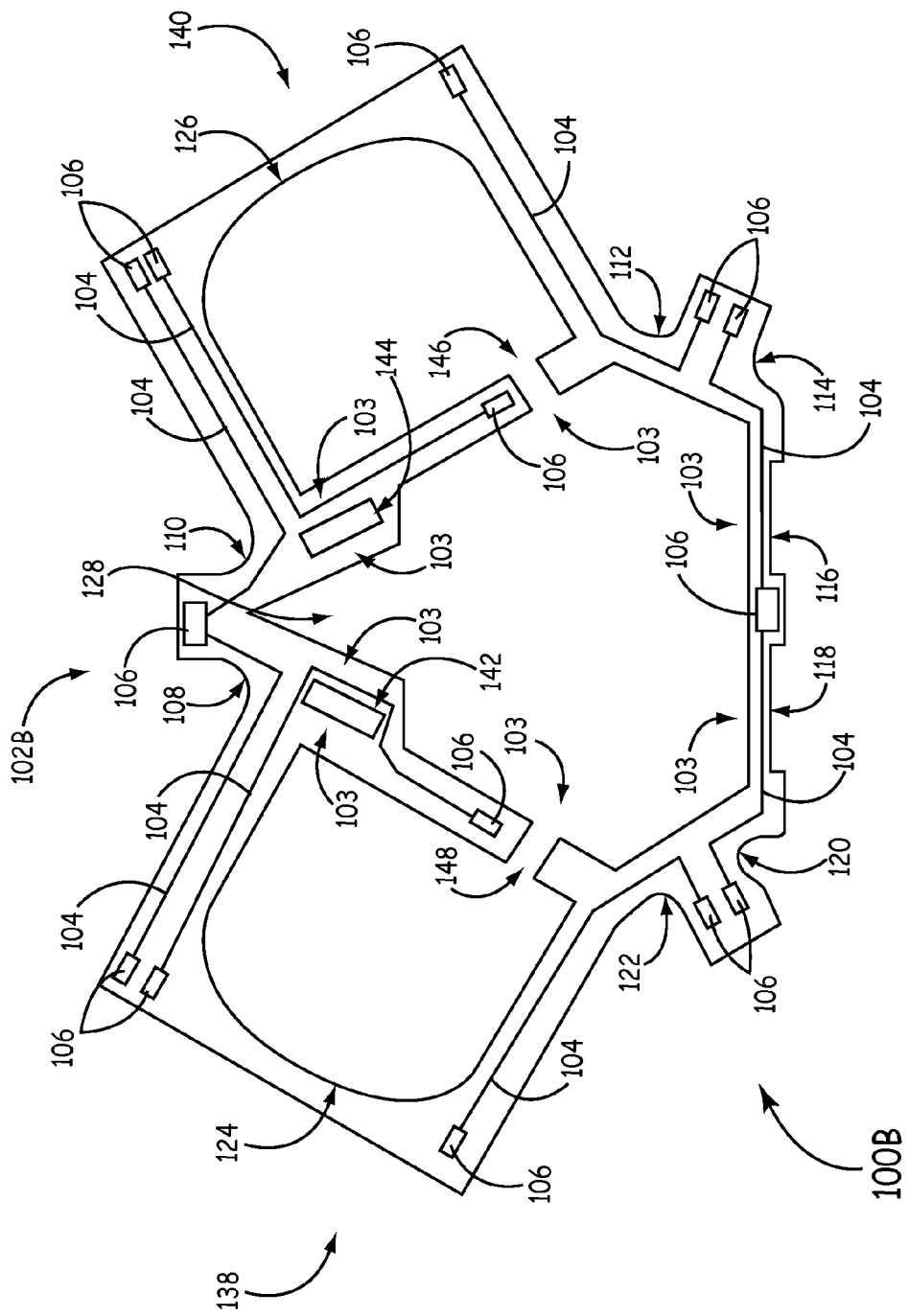
Figure 1C:
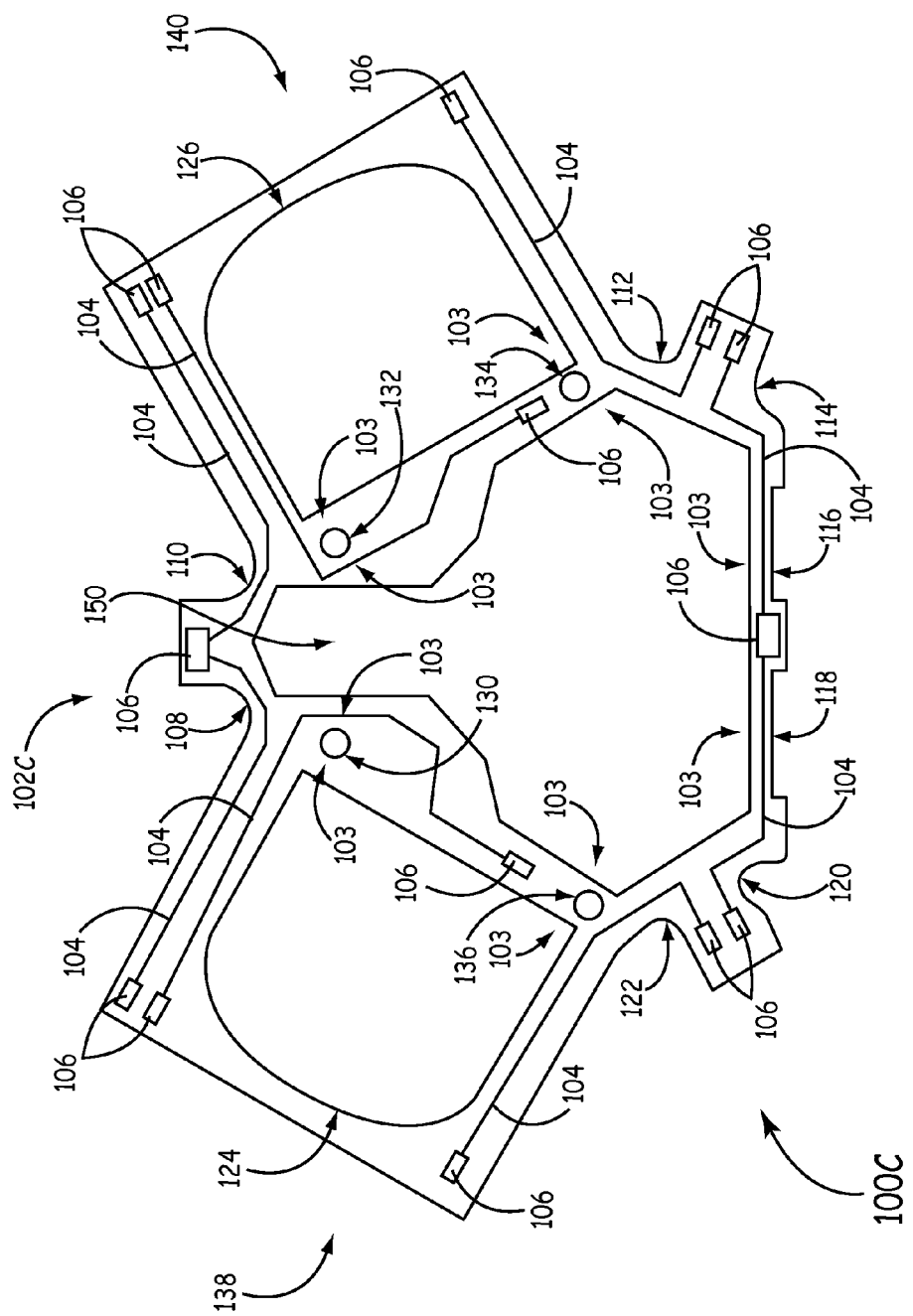

FIGS. 1A-1C are top view diagrams depicting circuit boards 100 having deformation points to mitigate block bending in a laser block. Each of FIGS. 1A-1C illustrates a different embodiment of the circuit board 100, labeled 100A through 100C respectively.

FIG. 1A is a top view diagram depicting circuit board 100A including a plurality of deformation points 103 created by cutouts 102A in addition to a plurality of conductive traces 104 and conductive contact pads 106 coupled to the conductive traces 104. The combination of the conductive contact pads 106 and the conductive traces 104 allows for coupling and communication between various devices. In exemplary embodiments, the circuit board 100A has devices coupled to it through various methods, such as surface mounting, through-hole mounting, or wired connection. In exemplary embodiments, the circuit board 100A includes through-hole vias allowing electrical signals and power to travel from one side of the flexible circuit board to the other. In exemplary embodiments, the flexible circuit board 102A includes a plurality of layers with through-hole vias and conductive traces allowing electric signals and power to travel between the plurality of layers. In exemplary embodiments, the circuit board 100A includes greater or fewer conductive traces 104 and conductive contact pads 106. In exemplary embodiments, the circuit board 100A only includes one conductive trace 104 and/or conductive contact pad 106.

In exemplary embodiments, the circuit board 100A is a flexible circuit board, such as a flex circuit designed using flexible printed circuit board (PCB). In other exemplary embodiments, the circuit board 100A is a rigid-flex circuit with portions of rigid PCB and portions of flexible PCB. In either flexible circuits or rigid-flex circuits, the flexible portions of the circuit board 100A allow the flexible circuit board material to bend and turn. In other exemplary embodiments, the circuit board 100A is a rigid circuit board, such as a rigid circuit designed using rigid PCB. In other embodiments, other suitable circuit board materials are used.

The cutouts 102A are configured to minimize the cross-sectional area of the circuit board 100A in locations to create deformation points 103 that absorb stresses developed in the circuit board 100A when the circuit board 100A experiences resistance to expansion or compression caused by connection to an object resisting expansion or compression. Thus, the deformation points 103 help minimize block bending in a laser block to which the circuit board 100A is attached. In exemplary embodiments, the cross-sectional area of the circuit board 100A can be further minimized by making the circuit board 100A thinner. In exemplary embodiments, deformation points are not created by reducing the cross-sectional area of the circuit board material. For example, the deformation points may be created by forming the circuit board material into specific geometries including forming folds, zig-zag shapes, accordion configuration, or other shapes to absorb the stresses by deforming. In other exemplary embodiments, a complete disconnect between two portions of the circuit board 100A becomes a deformation point 103 (such as the disconnects formed by cutouts 146 and 148 shown in FIGS. 1B and 2B).

The deformation points 103 absorb thermal stresses generated by the thermal expansion and contraction of the circuit board 100A that can be passed to the laser block. This is true of all deformation points 103, regardless of how they are created. Lower thermal stresses transferred to the laser block result in less block bending. Even in exemplary embodiments where the circuit board 100A is a flexible PCB, thermal expansion and compression of the flexible PCB generates stresses that can be transferred to the laser block (or other component, substrate, or object) and cause block bending. In exemplary embodiments this occurs even though the laser block is substantially more rigid than the flexible PCB. In exemplary embodiments, block bending affects the position of the lasing plane within a laser block, which can degrade the performance of a ring laser gyroscope and reduce the power of the lasers.

The cutouts 102A include both cutouts on the periphery of the circuit board 100A and cutouts surrounded by the circuit board 100A. The cutouts 102A on the periphery of the circuit board 100A include cutouts 108, 110, 112, 114, 116, 118, 120, and 122. The cutouts 102A surrounded by the circuit board 100A include cutouts 124, 126, 128, 130, 132, 134, and 136. The cutouts 102A in the circuit board 100A can be created in various ways, including but not limited etching, cutting, dicing, or stamping. While the cutouts 102A are shown as various shapes in FIG. 1A, other exemplary embodiments have different shapes of cutouts both on the periphery of the circuit board 100A and surrounded by the circuit board 100A. Specifically, while cutout 130, cutout 132, cutout 134, and cutout 136 are circular in shape in the exemplary embodiment of circuit board 100A shown in FIG. 1A, in other exemplary embodiments, these cutouts are different shapes, such as squares, triangles, rectangles, pentagons, octagons, ovals, diamonds, stars, and freeform shapes.

In exemplary embodiments, placement of the cutouts is restricted based on the location of the conductive traces 104, conductive contact pads 106, and other components and/or elements of the circuit board 100A. In exemplary embodiments, placement of the cutouts is selected to reduce/minimize the cross-sectional area of the circuit board 100A in at least one location. In exemplary embodiments, placement of the cutouts is selected to minimize the cross-sectional area of the circuit board 100A connecting at least two corners of the triangular shape created by the circuit board 100A. This area of minimized cross-sectional area is a deformation point 103.

For example, the size and placement of cutout 128 in addition to the size and placement of cutouts 116 and cutouts 118 minimizes the cross-sectional area of the circuit board 100A at the bottom of FIG. 1A. The minimized cross-sectional area of the circuit board 100A at the bottom of FIG. 1A substantially disconnects the bottom left corner and the bottom right corner of the circuit board from each other, such that these portions of the circuit board 100A are connected through deformation points 103 configured to absorb thermal stresses. In exemplary embodiments, other stresses are also absorbed by the deformation points 103.

In addition, the size and placement of cutout 126, cutout 128, and each of cutouts 132 and 134 minimize the cross-sectional area of the circuit board 100A on the right side of FIG. 1A. The minimized cross-sectional area of the circuit board 100A on the right side of FIG. 1A substantially disconnects the bottom right corner and the top corner of the circuit board from each other, such that these portions of the circuit board 100A are connected through deformation points 103 configured to absorb thermal stresses. In exemplary embodiments, other stresses are also absorbed by the deformation points 103.

Similarly, the size and placement of cutout 128, cutout 124, and each of cutouts 136 and 130 minimize the cross-sectional area of the circuit board 100A on the left side of FIG. 1A. The minimized cross-sectional area of the circuit board 100A on the left side of FIG. 1A substantially disconnects the bottom left corner and the top corner of the circuit board from each other, such that these portions of the circuit board 100A are connected through deformation points 103 configured to absorb thermal stresses. In exemplary embodiments, other stresses are also absorbed by the deformation points 103.

As will be shown below with reference to FIG. 2A, sizing and positioning of the cutouts 102A in this manner minimizes the cross-sectional area of the circuit board 100A between at least two mirrors of a laser block described below. These areas with minimized cross-sectional areas are deformation points 103. These deformation points 103 help absorb thermal stresses generated in the circuit board 100A between at least two mirrors of the laser block from each other and helps to minimize block bending in the lasing plane.

In exemplary embodiments, at least some of the cutouts are symmetrically positioned on the circuit board 100A, such as cutouts 130 and 132, cutouts 136 and 134, cutouts 118 and 116, etc. The symmetric positioning of the cutouts causes symmetric positioning of the deformation points 103 because they deform to absorb stresses before other parts of the circuit board 100A. In other exemplary embodiments, the cutouts are not symmetrically positioned. In exemplary embodiments, symmetrically positioned cutouts are approximately the same shape and size as each other, such as cutouts 130 and 132, cutouts 136 and 134, cutouts 118 and 116, etc.

In exemplary embodiments, a first service loop 138 is positioned on the left side of the circuit board 100A and a second service loop 140 is positioned on the right side of the circuit board 100A. In exemplary embodiments, these service loops include connectors used to communicatively couple the conductive traces 104, conductive contact pads 106, and the circuit board 100A generally to an external system. In exemplary embodiments, service loops 138 and 140 are flexible and minimize the transfer of stresses between the circuit board 100A and the external systems. In exemplary embodiments, the flexible service loops 138 and 140 are bent upward above the rest of the circuit board 100A where they are attached to the external systems. In exemplary embodiments, the service loops 138 and 140 include connectors for communicatively coupling to external systems.

FIG. 1B is a top view diagram depicting circuit board 100B including a plurality of cutouts 102B in addition to the plurality of conductive traces 104 and conductive contact pads 106 coupled to the conductive traces 104. Much of the design and components of circuit board 100B in FIG. 1B matches that of circuit board 100A in FIG. 1A and described above. Only the differences between circuit board 100B and circuit board 100A will be described below.

Instead of circular cutouts 130, 132, 134, and 136, circuit board 100B includes rectangular shaped cutouts 142, 144, 146, and 148. Both rectangular shaped cutout 142 and rectangular shaped cutout 144 are surrounded by circuit board 100B. In contrast, rectangular shaped cutout 146 and rectangular shaped cutout 148 are only partially surrounded by circuit board 100B. Specifically, rectangular shaped cutout 146 couples cutout 126 with cutout 128 and rectangular shaped cutout 148 couples cutout 124 with cutout 128. While rectangular shaped cutouts 146 and 148 effectively and advantageously reduces the cross-sectional area of the circuit board 100B to zero in two portions of the circuit board 100B, the exemplary embodiment of circuit board 100B shown in FIG. 1B may be more difficult to handle during manufacturing. As described above with reference to FIG. 1A, the deformation points may be created in other ways than by reducing cross-sectional area of the circuit board 100B, such as by forming the circuit board material into specific geometries including forming folds, zig-zag shapes, accordion configuration, or other shapes to absorb the stresses by deforming. In other exemplary embodiments, a complete disconnect between two portions of the circuit board 100B becomes a deformation point 103 (such as the disconnects formed by cutouts 146 and 148 shown in FIGS. 1B and 2B).

The cutouts 102B are configured to minimize the cross-sectional area of the circuit board 100B in locations to create deformation points 103 that absorb stresses developed in the circuit board 100B when the circuit board 100B experiences resistance to expansion or compression caused by connection to a substrate (or other object) resisting expansion or compression. The deformation points 103 help minimize block bending in a laser block (or other object) to which the circuit board 100B is attached. In exemplary embodiments, the cross-sectional area of the circuit board 100B can be further minimized by making the circuit board 100B thinner.

The deformation points 103 absorb the thermal stresses generated by the thermal expansion and contraction of the circuit board 100B that can be passed to the laser block (or other object). Lower thermal stresses transferred to the laser block result in less block bending. Even in exemplary embodiments where the circuit board 100B is a flexible PCB, thermal expansion and compression of the flexible PCB generates stresses that can be transferred to the laser block (or other component, substrate, or object) and cause block bending. In exemplary embodiments this occurs even though the laser block is substantially more rigid than the flexible PCB. In exemplary embodiments, block bending affects the position of the lasing plane within a laser block, which can degrade the performance of a ring laser gyroscope and reduce the power of the lasers.

In exemplary embodiments, placement of the cutouts is restricted based on the location of the conductive traces 104, conductive contact pads 106, and other components and/or elements of the circuit board 100B. In exemplary embodiments, placement of the cutouts is selected to reduce/minimize the cross-sectional area of the circuit board 100B in at least one location. In exemplary embodiments, placement of the cutouts is selected to minimize the cross-sectional area of the circuit board 100B connecting at least two corners of the triangular shape created by the circuit board 100B. This area of minimized cross-sectional area is a deformation point 103 that deforms before other parts of the circuit board 100B to absorb thermal and other stresses.

For example, the size and placement of cutout 128 in addition to the size and placement of cutouts 116 and cutouts 118 minimizes the cross-sectional area of the circuit board 100B at the bottom of FIG. 1B. The minimized cross-sectional area of the circuit board 100B at the bottom of FIG. 1B substantially disconnects the bottom left corner and the bottom right corner of the circuit board from each other, such that these portion of the circuit board 100B are connected through deformation points 103 configured to absorb thermal stresses. In exemplary embodiments, other stresses are also absorbed by the deformation points 103.

In addition, the size and placement of cutout 126, cutout 128, and each of cutouts 144 and 146 minimize the cross-sectional area of the circuit board 100B on the right side of FIG. 1A. The minimized cross-sectional area of the circuit board 100B on the right side of FIG. 1B substantially disconnects the bottom right corner and the top corner of the circuit board from each other, such that these portions of the circuit board 100A are connected through a few deformation points 103 configured to absorb thermal stresses. In exemplary embodiments, cutout 146 acts as a very deformable deformation point 103 that can absorb large amounts of thermal stresses. In exemplary embodiments, other stresses are also absorbed by the deformation points 103.

Similarly, the size and placement of cutout 128, cutout 124, and each of cutouts 142 and 148 minimize the cross-sectional area of the circuit board 100B on the left side of FIG. 1B. The minimized cross-sectional area of the circuit board 100B on the left side of FIG. 1B substantially disconnects the bottom left corner and the top corner of the circuit board from each other, such that these portions of the circuit board 100B are connected through a few deformation points 103 configured to absorb thermal stresses. In exemplary embodiments, cutout 148 acts as a very deformable deformation point 103 that can absorb large amounts of thermal stresses. In exemplary embodiments, other stresses are also absorbed by the deformation points 103.

As will be shown below with reference to FIG. 2B, sizing and positioning of the cutouts 102B in this manner minimizes the cross-sectional area of the circuit board 100B between at least two mirrors of a laser block described below. These areas with minimized cross-sectional areas are deformation points 103. These deformation points 103 help absorb thermal stresses generated in the circuit board 100B between at least two mirrors of the laser block from each other and helps to minimize block bending in the lasing plane. The deformation points 103 help absorb thermal stresses generated in the circuit board 100B between at least two mirrors of the laser block from each other and helps to minimize block bending in the lasing plane. In exemplary embodiments, other stresses are also absorbed by the deformation points 103.

In exemplary embodiments, at least some of the cutouts are symmetrically positioned on the circuit board 100B, such as cutouts 142 and 144, cutouts 148 and 146, cutouts 118 and 116, etc. The symmetric positioning of the cutouts causes symmetric positioning of the deformation points 103. In other exemplary embodiments, the cutouts are not symmetrically positioned. In exemplary embodiments, symmetrically positioned cutouts are approximately the same shape and size as each other, such as cutouts 142 and 144, cutouts 148 and 146, cutouts 118 and 116, etc.

FIG. 1C is a top view diagram depicting circuit board 100C including a plurality of cutouts 102C in addition to the plurality of conductive traces 104 and conductive contact pads 106 coupled to the conductive traces 104. Much of the design and components of circuit board 100C in FIG. 1C matches that of circuit board 100A in FIG. 1A and described above. Only the differences between circuit board 100C and circuit board 100A will be described below.

Cutout 150 replaces cutout 128 in the center of the circuit board 100C. Its shape is slightly different. In exemplary embodiments, the difference in shape is based on the position of the conductive traces 104, conductive contact pads 106, and other components. In other exemplary embodiments, differences in shape further reduce the cross-sectional area of the circuit board 100C in additional areas to further reduce thermal stresses generated by the expansion and contraction of the circuit board 100C in response to temperature changes in the environment surrounding the circuit board 100C.

The cutouts 102C are configured to minimize the cross-sectional area of the circuit board 100C in locations to create deformation points 103 that absorb stresses developed in the circuit board 100C when the circuit board 100C experiences resistance to expansion or compression caused by connection to an object resisting expansion or compression. The deformation points 103 help minimize block bending in a laser block to which the circuit board 100C is attached. In exemplary embodiments, the cross-sectional area of the circuit board 100C can be further minimized by making the circuit board 100C thinner. As described above with reference to FIG. 1A, the deformation points may be created in other ways than by reducing cross-sectional area of the circuit board 100B, such as by forming the circuit board material into specific geometries including forming folds, zig-zag shapes, accordion configuration, or other shapes to absorb the stresses by deforming. In other exemplary embodiments, a complete disconnect between two portions of the circuit board 100C becomes a deformation point 103 (such as the disconnects formed by cutouts 146 and 148 shown in FIGS. 1B and 2B).

The deformation points 103 absorb the thermal stresses generated by the thermal expansion and contraction of the circuit board 100C that can be passed to the laser block. This is true of all deformation points 103, regardless of how they are created. In exemplary embodiments, other stresses are also absorbed by the deformation points 103. Lower thermal stresses transferred to the laser block result in less block bending. Even in exemplary embodiments where the circuit board 100C is a flexible PCB, thermal expansion and compression of the flexible PCB generates stresses that can be transferred to the laser block (or other component, substrate, or object) and cause block bending. In exemplary embodiments this occurs even though the laser block is much more rigid than the flexible PCB. In exemplary embodiments, block bending affects the position of the lasing plane within a laser block, which can degrade the performance of a ring laser gyroscope and reduce the power of the lasers.

In addition, the placement of cutouts 130 and 132 in circuit board 100C is slightly different than in circuit board 100A. In exemplary embodiments, the change in placement of cutouts 130 and 132 is at least partly due to the change in placement of the conductive traces 104 and/or the conductive contact pads 106. In exemplary embodiments, the change in placement of cutouts 130 and 132 is at least partly designed to further minimize the cross-sectional area of the circuit board 100C. In exemplary embodiments, placement of the cutouts is selected to minimize the cross-sectional area of the circuit board 100C connecting at least two corners of the triangular shape created by the circuit board 100C. This area of minimized cross-sectional area is a deformation point 103 that deforms before other parts of the circuit board 100B to absorb thermal and other stresses.

For example, the size and placement of cutout 150 in addition to the size and placement of cutouts 116 and cutouts 118 minimizes the cross-sectional area of the circuit board 100C at the bottom of FIG. 1C. The minimized cross-sectional area of the circuit board 100C at the bottom of FIG. 1C substantially disconnects the bottom left corner and the bottom right corner of the circuit board from each other, such that these portions of the circuit board 100C are connected through deformation points 103 configured to absorb thermal stresses. In exemplary embodiments, other stresses are also absorbed by the deformation points 103.

In addition, the size and placement of cutout 126, cutout 150, and each of cutouts 132 and 134 minimize the cross-sectional area of the circuit board 100C on the right side of FIG. 1C. The minimized cross-sectional area of the circuit board 100C on the right side of FIG. 1C substantially disconnects the bottom right corner and the top corner of the circuit board from each other, such that these portions of the circuit board 100C are connected through deformation points 103 configured to absorb thermal stresses. In exemplary embodiments, other stresses are also absorbed by the deformation points 103.

Similarly, the size and placement of cutout 126, cutout 150, and each of cutouts 136 and 130 minimize the cross-sectional area of the circuit board on the left side of FIG. 1C. The minimized cross-sectional area of the circuit board 100C on the left side of FIG. 1C substantially disconnects the bottom left corner and the top corner of the circuit board from each other, such that these portions of the circuit board 100C are connected through deformation points 103 configured to absorb thermal stresses. In exemplary embodiments, other stresses are also absorbed by the deformation points 103.

As will be shown below with reference to FIG. 2C, sizing and positioning of the cutouts 102C in this manner minimizes the cross-sectional area of the circuit board 100C between at least two mirrors of a laser block described below. These areas with minimized cross-sectional areas are deformation points 103. These deformation points 103 help absorb thermal stresses generated in the circuit board 100C between at least two mirrors of the laser block from each other and helps to minimize block bending in the lasing plane. In exemplary embodiments, other stresses are also absorbed by the deformation points 103.

In exemplary embodiments, at least some of the cutouts are symmetrically positioned on the circuit board 100C, such as cutouts 130 and 132, cutouts 136 and 134, cutouts 118 and 116, etc. The symmetric positioning of the cutouts causes symmetric positioning of the deformation points 103. In other exemplary embodiments, the cutouts are not symmetrically positioned. In exemplary embodiments, symmetrically positioned cutouts are approximately the same shape and size as each other, such as cutouts 130 and 132, cutouts 136 and 134, cutouts 118 and 116, etc.

It is understood that other embodiments may combine features of the exemplary embodiments shown in FIGS. 1A-1C and may have different features, such as asymmetric cutout layouts and designs, and different shapes of cutouts. In addition, the general shape of the circuit board may be different than the triangular shape of the circuit boards 100A-100C shown in FIGS. 1A-1C respectively. Specifically, if the laser block, substrate, or other object to which the circuit board will be attached has a different shape, the circuit board itself will be adapted accordingly. For example, in exemplary embodiments designed for square ring laser gyroscopes, the circuit board itself will have a generally square shape. In other exemplary embodiments, the circuit board does not have the same shape as the laser block, substrate, or other object to which it is attached.

Figure 2A:
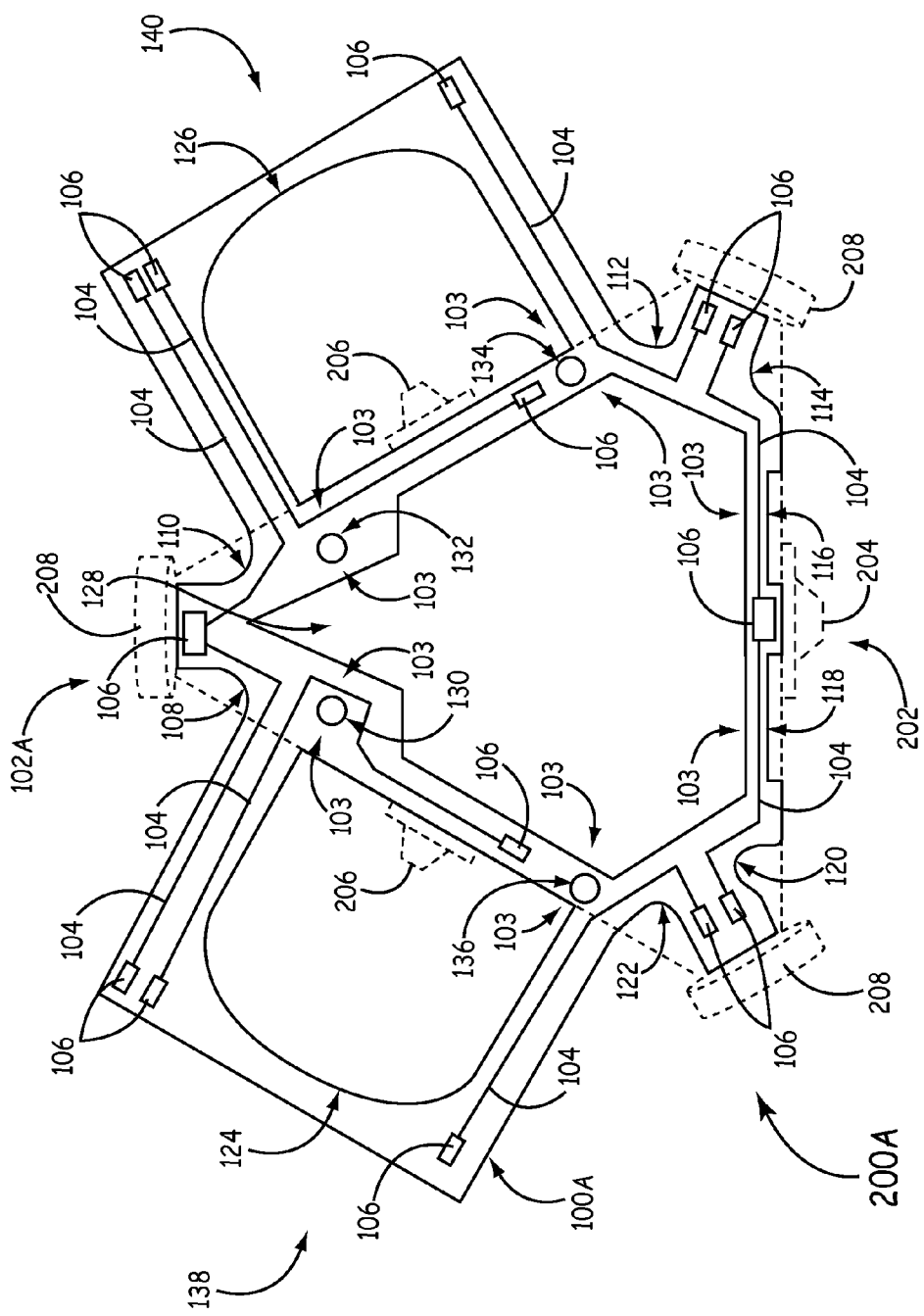
FIGS. 2A-2C are top view diagrams depicting exemplary embodiments of a circuit board attached to a ring laser gyroscope (RLG) and having deformation points to mitigate block bending in the laser block of the RLG.
Figure 2B:
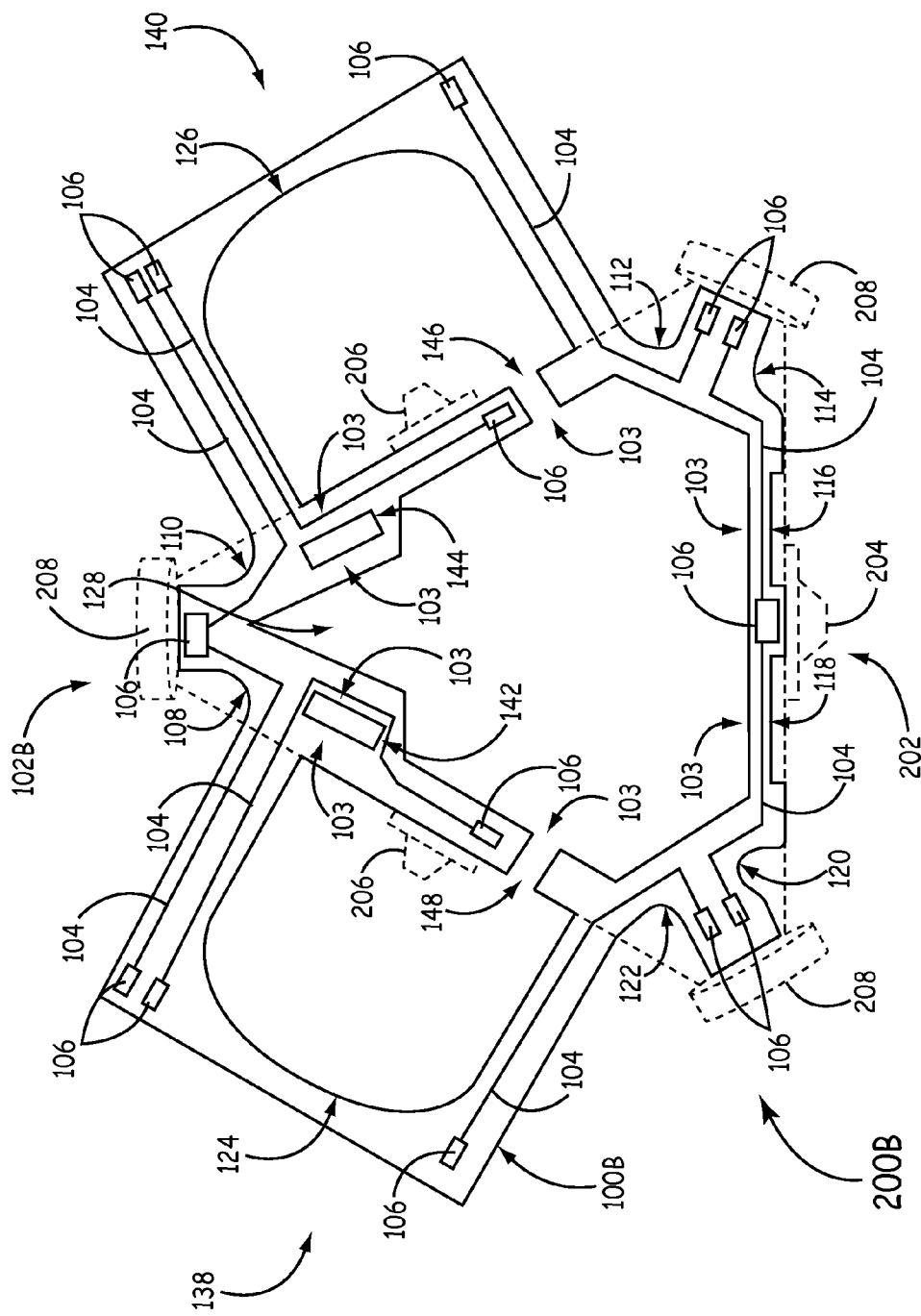
Figure 2C:
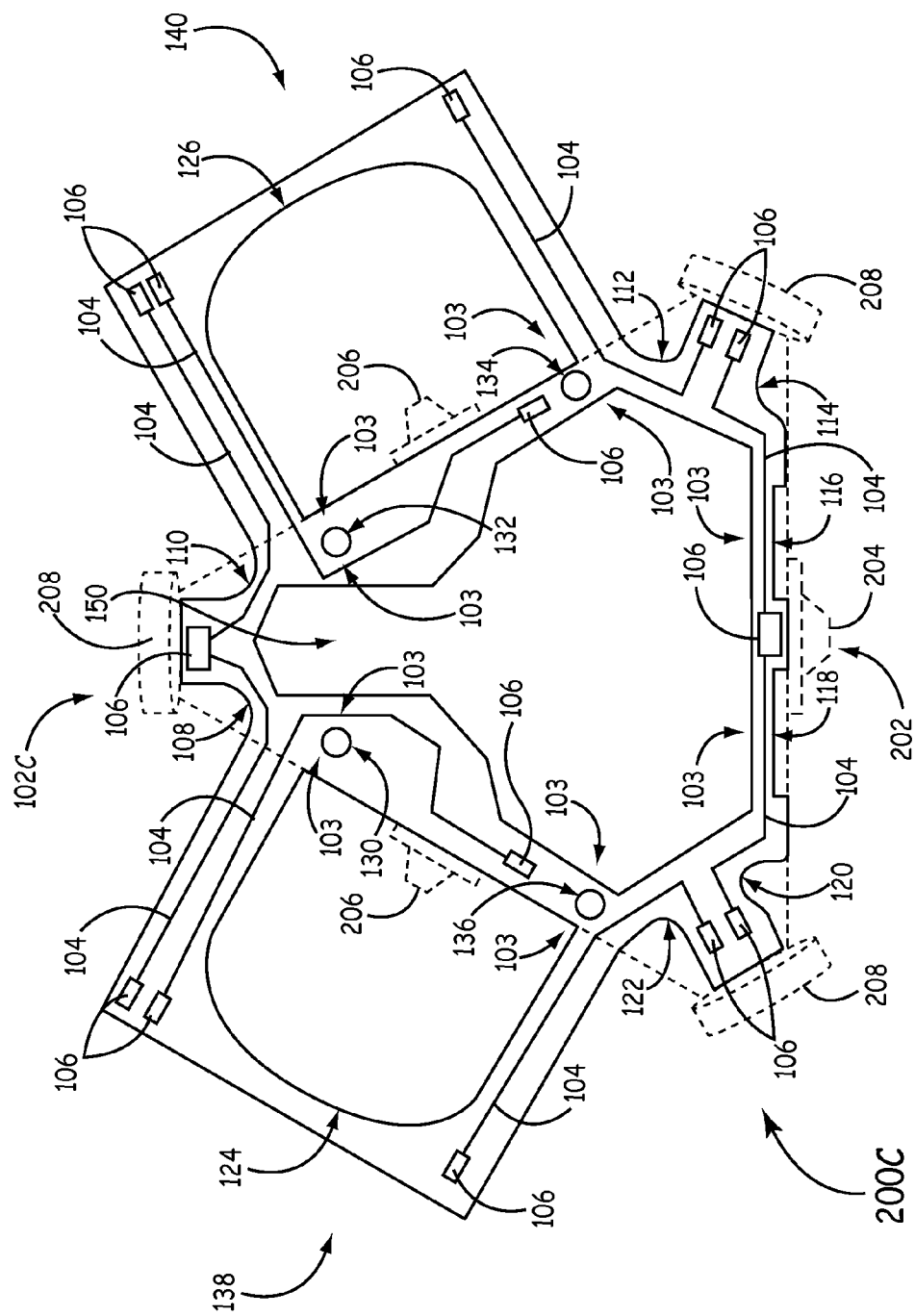

FIG. 2A-2C are top view diagrams depicting exemplary embodiments of circuit boards 100 attached to a ring laser gyroscope (RLG) 202 to reduce block bending in a laser block of the RLG 202. Each of FIGS. 2A-2C illustrates a different embodiment of the circuit board assembly 200, labeled 200A through 200C respectively.

FIG. 2A is a top view diagram depicting circuit board 100A attached to RLG 202 to reduce block bending in a laser block of the RLG 202. RLG 202 is shown using phantom lines for clarity because it is positioned below the circuit board 100A. The circuit board 100A is described in detail with regards to FIG. 1A and the accompanying description above. The circuit board 100A is attached to the RLG 202 using an adhesive or other type of bonding. In exemplary embodiments, the adhesive used to attach the circuit board 100A to the RLG 202 is selected according to the description below with reference to FIG. 3. In addition, in exemplary embodiments, various components of the RLG 202 (such as cathode 204 and anodes 206) are communicatively coupled to the conductive contact pads 106 and conductive traces 104 of the circuit board 100A using wire or other conductive leads.

FIG. 2B is a top view diagram depicting circuit board 100B attached to RLG 202 to reduce block bending in a laser block of the RLG 202. RLG 202 is shown using phantom lines for clarity because it is positioned below the circuit board 100B. The circuit board 100B is described in detail with regards to FIG. 1B and the accompanying description above. The circuit board 100B is attached to the RLG 202 using an adhesive or other type of bonding. In exemplary embodiments, the adhesive used to attach the circuit board 100B to the RLG 202 is selected according to the description below with reference to FIG. 3. In addition, in exemplary embodiments, various components of the RLG 202 (such as cathode 204 and anodes 206) are communicatively coupled to the conductive contact pads 106 and conductive traces 104 of the circuit board 100B using wire or other conductive leads.

FIG. 2C is a top view diagram depicting circuit board 100C attached to RLG 202 to reduce block bending in a laser block of the RLG 202. RLG 202 is shown using phantom lines for clarity because it is positioned below the circuit board 100C. The circuit board 100C is described in detail with regards to FIG. 1C and the accompanying description above. The circuit board 100C is attached to the RLG 202 using an adhesive or other type of bonding. In exemplary embodiments, the adhesive used to attach the circuit board 100C to the RLG 202 is selected according to the description below with reference to FIG. 3. In addition, in exemplary embodiments, various components of the RLG 202 (such as cathode 204 and anodes 206) are communicatively coupled to the conductive contact pads 106 and conductive traces 104 of the circuit board 100C using wire or other conductive leads.

FIG. 3 is a side view diagram depicting an exemplary embodiment of a circuit board assembly 300 including a circuit board 102 (such as any of circuit boards 100A through 100C) attached to a laser block 302 of an RLG (such as RLG 202) with a particular adhesive to reduce block bending to a laser block 302 of the RLG. The circuit board assembly 300 is attached to the laser block 302 of the RLG with an adhesive material 304 that minimizes the transfer of forces between the circuit board 102 and the laser block 302 of the RLG. Specifically, the adhesive material minimizes the transfer of the thermally compressive and thermally expansive forces caused by changes in temperature. In exemplary embodiments, the adhesive material chosen has a low modulus of elasticity and a low glass transition temperature.

A modulus of elasticity for an adhesive is a measurement of the adhesive's tendency to be deformed elastically when a force is applied to it. An adhesive with a low modulus of elasticity will not transmit the thermally compressive and expansive forces as easily as adhesives with a higher modulus of elasticity.

A glass transition temperature for an adhesive is the temperature at which the adhesive transitions from a hard and relatively brittle state into a molten or rubber-like state. An adhesive with a low glass transition temperature will be in the molten or rubber-like state for a larger temperature range. If an adhesive transitions from the molten or rubber-like state into the hard and relatively brittle state, it will begin to transmit the thermally compressive and expansive forces more.

In exemplary embodiments, the thickness of the adhesive 304 between the circuit board 102 and the laser block 302 is also selected to minimize transmission of thermally compressive and expansive forces. Specifically, in exemplary embodiments, thicker adhesive layers further minimize transmission of thermally compressive and expansive forces between the circuit board 102 and the laser block 302.

In exemplary embodiments, the adhesive 304 between the circuit board 102 and the laser block 302 is positioned between the entire bottom surface of the circuit board 102 and the top surface of the laser block 302. In other exemplary embodiments, the adhesive 304 between the circuit board 102 and the laser block 302 is only positioned between portions of the bottom surface of the circuit board 102 and the top surface of the laser block 302 to further decouple the circuit board 102 from the laser block 302.

Thus, in exemplary embodiments, the adhesive 304 is chosen based on its modulus of elasticity being low enough to minimize the transmission of thermally compressive and expansive forces between the circuit board 102 and the laser block 302. Similarly, in exemplary embodiments, the adhesive 304 is chosen based on its glass transition temperature being as low as possible within the temperature operating range of the RLG 202 so that the adhesive will not transition into the hard and relatively brittle state that would transmit thermally compressive and expansive forces more than when the adhesive 304 is in its molten or rubber-like state. In exemplary embodiments, it is desirable that the adhesive 304 have consistent stress transfer properties across an operating temperature range so that the adhesive 304 does not stop minimizing the transmission of thermally compressive and expansive forces at a temperature within the operating temperature range. In exemplary embodiments, the adhesive 304 is an acrylic foam pressure sensitive adhesive (PSA).

In exemplary embodiments, the adhesive 304 is also chosen based on its thermal and electrical conductivity. Specifically, in exemplary embodiments it is desirable to select an adhesive 304 with low thermal and electrical conductivity to avoid thermal or electrical transfer between the circuit board 102 and the laser block 302 through the adhesive 304.

While each of the methodologies for minimizing block bending described above, including (1) creating deformation points 103 by minimizing the cross-sectional area of portions of the circuit board 102 (and by creating deformation points in other ways); and (2) using an adhesive 304 that minimizes the transfer of forces between the circuit board 102 and the laser block 302 can be implemented individually, exemplary embodiments combine the methodologies into apparatuses, systems, and methods to produce the best results. Thus, exemplary embodiments of systems and methods include two prongs. First, by minimizing the cross-sectional area of the circuit board 102, fewer forces are developed based on thermal compression and expansion. Second, by using the adhesive material 304 with the low modulus of elasticity and the low glass transition temperature, the remaining thermal stresses that are generated from the expansion or contraction of the circuit board 102 of the circuit board assembly 300 are de-coupled from the laser block 302, further mitigating block bending.

Figure 4:
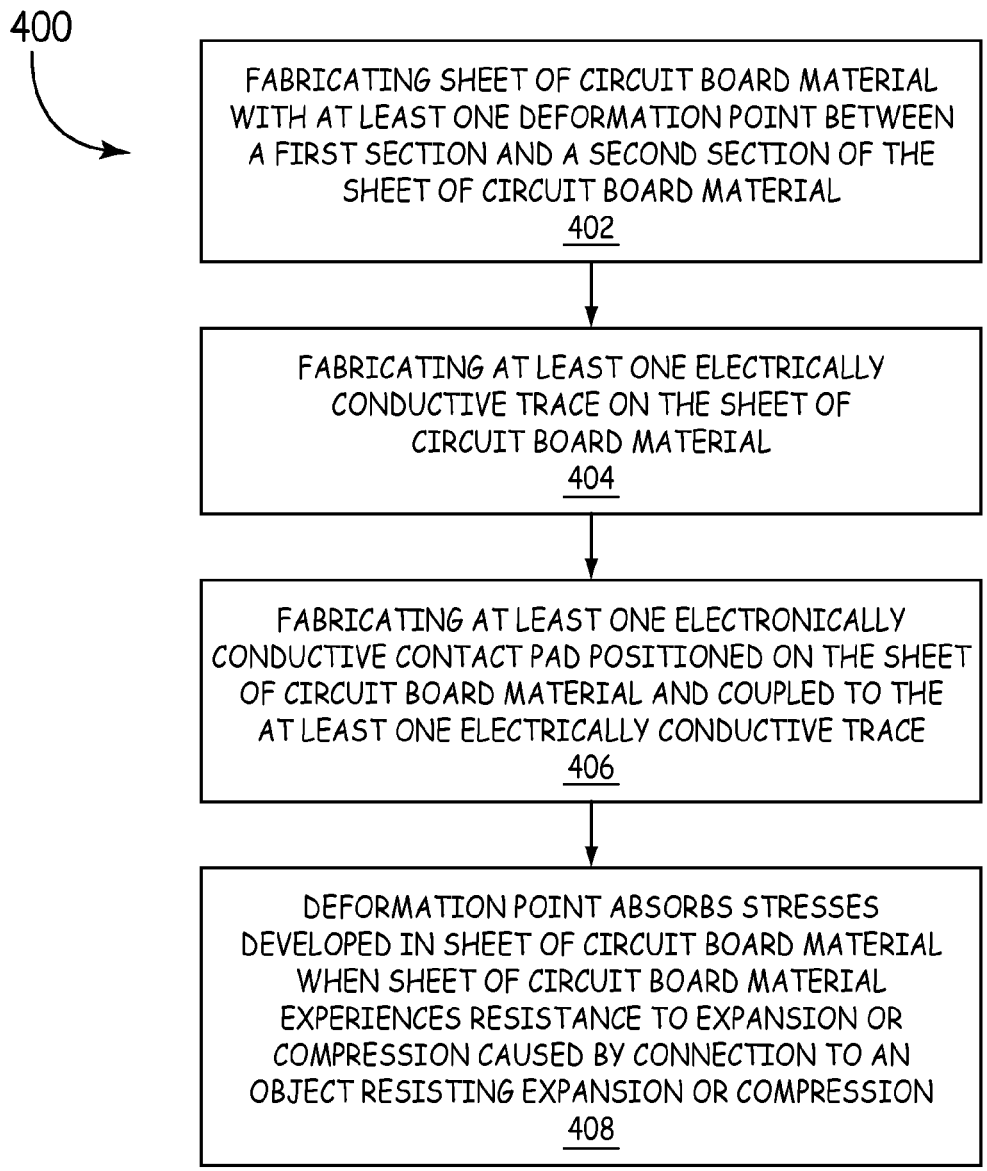
FIG. 4 is a flow chart illustrating an example method for manufacturing a circuit board having deformation points to mitigate block bending in a substrate.

FIG. 4 is a flow chart illustrating an example method 400 for manufacturing a circuit board having deformation points to reduce block bending in a substrate. At block 402, a sheet of circuit board material is fabricated with at least one deformation point between a first section and a second section of the sheet of circuit board material. In exemplary embodiments, the deformation points are created with cutouts that reduce the cross-sectional area of a sheet of circuit board material in at least one section. As described above, in other exemplary embodiments, the deformation points may be created in other ways than by reducing cross-sectional area of the circuit board, such as by forming the circuit board material into specific geometries including forming folds, zig-zag shapes, accordion configuration, or other shapes to absorb the stresses by deforming. In other exemplary embodiments, a complete disconnect between two portions of the circuit board becomes a deformation point (such as the disconnects formed by cutouts 146 and 148 shown in FIGS. 1B and 2B).

At block 404, at least one electrically conductive trace is fabricated on the sheet of circuit board material. At block 406, at least one electrically conductive contact pad is positioned on the sheet of circuit board material and coupled to the at least one electrically conductive trace 406. At block 408, the deformation points absorb thermal stresses developed in the sheet of circuit board material when the sheet of circuit board material experiences resistance to expansion or compression caused by connection to an object resisting expansion or compression. In exemplary embodiments, the expansion or compression is caused by temperature changes in the circuit board material.

Figure 5:
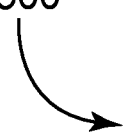
FIG. 5 is a flow chart illustrating an example method for attaching a sheet of circuit board material to a substrate to mitigate block bending in the substrate caused by expansion or compression of the sheet of circuit board material.

FIG. 5 is a flow chart illustrating an example method 500 for attaching a sheet of circuit board material to a substrate to mitigate block bending in the substrate caused by expansion or compression of the sheet of circuit board material. At block 502, a bottom surface of a sheet of circuit board material is bonded to a top surface of a substrate using an adhesive configured to inhibit the transfer of stresses generated in the sheet of circuit board material when the sheet of circuit board material expands or contracts at a different rate than the substrate. In exemplary embodiments, the sheet of circuit board material has a first coefficient of thermal expansion and the substrate has a second coefficient of thermal expansion that is different than the first coefficient of thermal expansion of the circuit board. In exemplary embodiments, method 500 is combined with method 400 to further reduce block bending.

Although specific embodiments have been illustrated and described herein, it will be appreciated by those of ordinary skill in the art that any arrangement, which is calculated to achieve the same purpose, may be substituted for the specific embodiments shown. Therefore, it is manifestly intended that this invention be limited only by the claims and the equivalents thereof.

What is claimed is:

1. An apparatus comprising:
   a sheet of circuit board material;
   at least one electrically conductive trace positioned on the sheet of circuit board material;
   at least one electrically conductive contact pad positioned on the sheet of circuit board material and coupled to the at least one electrically conductive trace;
   a first connection point configured to connect the sheet of circuit board material to an object resisting expansion or compression;
   a second connection point configured to connect the sheet of circuit board material to the object resisting expansion or compression; and
   at least one deformation point positioned between the first connection point and the second connection point and configured to absorb stresses developed in the sheet of circuit board material when the sheet of circuit board material experiences resistance to expansion or compression caused by connection to the object resisting expansion or compression at the first connection point and the second connection point, wherein the absorption of stresses developed in the sheet of circuit board material minimizes the transfer of the stresses to the object resisting expansion or compression.

2. The apparatus of claim 1, wherein the sheet of circuit board material is created using at least one of flexible printed circuit board, rigid printed circuit board, and a combination of flexible printed circuit board and rigid printed circuit board.

3. The apparatus of claim 1, wherein the at least one deformation point is created by removing circuit board material from the sheet of circuit board material to reduce a cross-sectional area of the sheet of circuit board material at a first location on the sheet circuit board material.

4. The apparatus of claim 3, wherein the removed circuit board material has a circular shape.

5. The apparatus of claim 1, wherein the circuit board material includes a plurality of cutouts, each configured to create at least one deformation point in at least one location between a first section and a second section of the sheet of circuit board material, wherein each deformation point absorbs stresses developed between the first section and the second section of the sheet of circuit board material.

6. The apparatus of claim 5, wherein the plurality of cutouts are arranged on the surface of the sheet of circuit board material in a symmetric pattern.

7. The apparatus of claim 1, further comprising:
   a substrate with a top surface, wherein the object resisting expansion or compression is the substrate;
   adhesive material attaching the top surface of the substrate with a bottom surface of the sheet of circuit board material; and
   wherein the adhesive material inhibits the transfer of stresses generated in the sheet of circuit board material when the sheet of circuit board material expands or contracts at a different rate from the substrate to which the sheet of circuit board material is attached.

8. The apparatus of claim 1, wherein the adhesive material has consistent stress transfer properties across an operating temperature range.

9. An apparatus comprising:
   an object resisting expansion or compression, the object having a top surface and a first coefficient of thermal expansion;
   a circuit board having a bottom surface and a second coefficient of thermal expansion that is different than the first coefficient of thermal expansion of the object;
   a first connection point configured to connect the sheet of circuit board material to the object resisting expansion or compression;

a second connection point configured to connect the sheet of circuit board material to the object resisting expansion or compression; and adhesive material bonding the bottom surface of the circuit board to the top surface of the object at the first connection point and the second connection point, wherein the adhesive material is configured to inhibit the transfer of stresses generated in the circuit board when the circuit board experiences resistance to expansion or compression caused by connection to the object resisting expansion or compression.

10. The apparatus of claim 9, wherein the object is a laser block.

11. The apparatus of claim 9, wherein the circuit board is formed from a sheet of circuit board material; and
  wherein the circuit board includes at least one electrically conductive trace positioned on a top surface.

12. The apparatus of claim 9, wherein the second coefficient of thermal expansion of the circuit board is greater than the first coefficient of thermal expansion of the object.

13. The apparatus of claim 9, wherein the adhesive material has consistent stress transfer properties across an operating temperature range.

14. The apparatus of claim 9, wherein the circuit board includes at least one deformation point configured to absorb stresses developed in the circuit board when the circuit board experiences resistance to expansion or compression caused by the bond between the circuit board and the object through the adhesive material.

15. The apparatus of claim 14, wherein the at least one deformation point is created by removing circuit board material to reduce the cross-sectional area of the circuit board at a first location on the circuit board.

16. The apparatus of claim 14, wherein the circuit board includes a plurality of cutouts, each configured to create at least one deformation point in at least one location between a first section and a second section of the circuit board, wherein each deformation point absorbs stresses developed between the first section and the second section of the circuit board material.

17. A method comprising:
  fabricating a sheet of circuit board material with at least one deformation point between a first section and a second section of the sheet of circuit board material, the first section of the sheet of circuit board material having a first connection point and the second section of the sheet of circuit board material having a second connection point;
  fabricating at least one electrically conductive trace on the sheet of circuit board material;
  fabricating at least one electrically conductive contact pad positioned on the sheet of circuit board material and coupled to the at least one electrically conductive trace; and
  wherein the at least one deformation point absorbs stresses developed in the sheet of circuit board material when the sheet of circuit board material experiences resistance to expansion or compression caused by connection to an object resisting expansion or compression at the first connection point and the second connection point, wherein the absorption of stresses developed in the sheet of circuit board material minimizes the transfer of the stresses to the object resisting expansion or compression.

18. The method of claim 17, further comprising:
  mounting a bottom surface of the sheet of circuit board material to a top surface of a substrate using an adhesive; and
  wherein the adhesive material is configured to inhibit the transfer of stresses generated in the sheet of circuit board material when the sheet of circuit board material expands or contracts at the different rate than the object.

19. An apparatus comprising:
  a circuit board having a bottom surface and at least one deformation point between a first section and a second section of the sheet of circuit board, the first section of the circuit board having a first connection point and the second section of the circuit board having a second connection point;
  an object having a top surface;
  adhesive material attaching the bottom surface of the circuit board to the top surface of the object;
  wherein the at least one deformation point absorbs stresses developed in the sheet of circuit board material when the sheet of circuit board material experiences resistance to expansion or compression caused by connection to an object resisting expansion or compression at the first connection point and the second connection point, wherein the absorption of stresses developed in the circuit board minimizes the transfer of the stresses to the object resisting expansion or compression; and
  wherein the adhesive material inhibits transfer of stresses from the circuit board to the object.

20. The apparatus of claim 19, wherein the circuit board is a flexible printed circuit board.

* * * * *